(12) United States Patent
Cahill et al.

(10) Patent No.: US 9,824,997 B2
(45) Date of Patent: Nov. 21, 2017

(54) DIE PACKAGE WITH LOW ELECTROMAGNETIC INTERFERENCE INTERCONNECTION

(71) Applicant: ROSENBERGER HOCHFREQUENZTECHNIK GMBH & CO. KG, Fridolfing (DE)

(72) Inventors: Sean S. Cahill, Santa Clara, CA (US); Eric A. Sanjuan, Santa Clara, CA (US)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 14/902,510

(22) PCT Filed: Jul. 2, 2014

(86) PCT No.: PCT/EP2014/001825
§ 371 (c)(1),
(2) Date: Dec. 31, 2015

(87) PCT Pub. No.: WO2015/000596
PCT Pub. Date: Jan. 8, 2015

(65) Prior Publication Data
US 2016/0379954 A1    Dec. 29, 2016

Related U.S. Application Data

(60) Provisional application No. 61/842,943, filed on Jul. 3, 2013, provisional application No. 61/842,944, filed on Jul. 3, 2013.

(51) Int. Cl.
*H01L 29/66* (2006.01)
*H01L 23/00* (2006.01)
(Continued)

(52) U.S. Cl.
CPC .......... *H01L 24/49* (2013.01); *H01L 23/4952* (2013.01); *H01L 23/49861* (2013.01);
(Continued)

(58) Field of Classification Search
CPC ........... H01L 23/4952; H01L 23/49861; H01L 23/50; H01L 23/552
(Continued)

(56) References Cited

U.S. PATENT DOCUMENTS 5,625,235 A     4/1997  Takiar
5,921,818 A *   7/1999  Larsen ............... H01R 13/6467
                                                    439/344

(Continued)

FOREIGN PATENT DOCUMENTS

JP      H6-13421      1/1994
JP      2008-167036   7/2008
(Continued)

*Primary Examiner* — Tan N Tran
(74) *Attorney, Agent, or Firm* — DeLio, Peterson & Curcio LLC; Robert Curcio

(57) ABSTRACT

A die package having lead structures connecting to a die that provide for electromagnetic interference reductions. Mixed impedance leads connected to the die have a first lead with a first metal core, a dielectric layer surrounding the first metal core, and first outer metal layer connected to ground; and a second lead with a second metal core, and a second dielectric layer surrounding the second metal core, and a second outer metal layer connected to ground. Each lead reducing susceptibility to EMI and crosstalk.

17 Claims, 12 Drawing Sheets

(51) Int. Cl.
    *H01L 23/50*     (2006.01)
    *H01L 23/552*     (2006.01)
    *H01L 23/66*     (2006.01)
    *H01L 25/065*     (2006.01)
    *H01L 25/10*     (2006.01)
    *H01L 23/495*     (2006.01)
    *H01L 23/498*     (2006.01)

(52) U.S. Cl.
    CPC ............ *H01L 23/50* (2013.01); *H01L 23/552* (2013.01); *H01L 23/66* (2013.01); *H01L 24/48* (2013.01); *H01L 24/85* (2013.01); *H01L 24/97* (2013.01); *H01L 25/0652* (2013.01); *H01L 25/0657* (2013.01); *H01L 25/105* (2013.01); *H01L 24/45* (2013.01); *H01L 2223/6611* (2013.01); *H01L 2223/6638* (2013.01); *H01L 2224/05553* (2013.01); *H01L 2224/32145* (2013.01); *H01L 2224/32225* (2013.01); *H01L 2224/32245* (2013.01); *H01L 2224/45015* (2013.01); *H01L 2224/4556* (2013.01); *H01L 2224/4569* (2013.01); *H01L 2224/45565* (2013.01); *H01L 2224/48011* (2013.01); *H01L 2224/48091* (2013.01); *H01L 2224/48137* (2013.01); *H01L 2224/48145* (2013.01); *H01L 2224/48227* (2013.01); *H01L 2224/48247* (2013.01); *H01L 2224/4903* (2013.01); *H01L 2224/4917* (2013.01); *H01L 2224/49109* (2013.01); *H01L 2224/49171* (2013.01); *H01L 2224/73265* (2013.01); *H01L 2224/8592* (2013.01); *H01L 2224/85444* (2013.01); *H01L 2224/85931* (2013.01); *H01L 2224/85935* (2013.01); *H01L 2224/85939* (2013.01); *H01L 2224/97* (2013.01); *H01L 2225/0651* (2013.01); *H01L 2225/06537* (2013.01); *H01L 2924/00014* (2013.01); *H01L 2924/15311* (2013.01); *H01L 2924/181* (2013.01); *H01L 2924/3011* (2013.01); *H01L 2924/3025* (2013.01)

(58) Field of Classification Search
    USPC ........................................ 257/659, 660, 672
    See application file for complete search history.

(56) References Cited

U.S. PATENT DOCUMENTS

| | | | |
|---|---|---|---|
| 8,581,113 B2* | 11/2013 | Sanjuan | ................ H01L 23/047 174/262 |
| 2002/0140112 A1 | 10/2002 | Pon | |
| 2003/0159262 A1 | 8/2003 | Pasternak | |
| 2006/0185892 A1 | 8/2006 | Guengerich et al. | |
| 2009/0159320 A1 | 6/2009 | Sanjuan | |
| 2009/0203172 A1* | 8/2009 | Khan | ................... H01L 23/3677 438/122 |
| 2013/0154075 A1 | 6/2013 | Kanemoto | |

FOREIGN PATENT DOCUMENTS

| | | |
|---|---|---|
| JP | 2008227126 A | 9/2008 |
| JP | 2009-111010 | 5/2009 |
| WO | 9217905 A1 | 10/1992 |

* cited by examiner

Single-ended bond wires

Single-ended microCoax

Differential bond wires

Differential microCoax

DIE PACKAGE WITH LOW ELECTROMAGNETIC INTERFERENCE INTERCONNECTION

BACKGROUND OF THE INVENTION

1. Field of the Invention

The invention relates to novel lead structures connecting to die that provide for electromagnetic interference reductions. Crosstalk between leads, as well as susceptibility to noise created by electromagnetic emissions internal or external to the package, are reduced through the implementation of the invention.

Further, the invention relates to novel multiple ground planes formed to connect dielectric coated leads connecting to one or more dies.

2. Description of Related Art

Electromagnetic interference leading to reduced performance is an increasingly common problem for packaged die, particularly for die having input/output (IO) operating at Gigahertz frequencies. Many integrated circuits generate undesirable amounts of EMI. Typically, the noise generated by the integrated circuit originates from the die and its connections to the pins through the package. As the EMI is coupled to neighboring components and integrated circuits, it interferes with their individual performance which may, in turn, affect the overall performance of a system. Because of the negative effects of EMI and because the level of acceptable radiated EMI is subject to strict regulatory limits, it is desirable to contain or suppress the EMI generated by an integrated circuit.

Solutions such as separation of leads or isolation with shields are not always available or sufficient. Furthermore, EMI solutions at the IC package level are often ignored because the main concerns at that level are signal integrity and functionality. It would be beneficial to have an EMI solution at the package level because it would help reduce the need for "downstream" or add-on solutions.

SUMMARY OF THE INVENTION

Bearing in mind the problems and deficiencies of the prior art, it is therefore an object of the present invention to provide a compact die package and in particular a stacked die package and/or BGA package with two or more leads providing excellent signal integrity and functionality.

The above and other objects, which will be apparent to those skilled in the art, are achieved in the present invention which is directed in a first aspect to a die package for EMI attenuation, comprising a die having a plurality of connection pads; a die substrate supporting a plurality of connection elements; a first lead having a first metal core with a first metal core diameter, a first dielectric layer surrounding said first metal core having a first dielectric thickness, and a first outer metal layer surrounding said first dielectric layer, said first outer metal layer attached to ground; and a second lead having a second metal core with a second metal core diameter, a second dielectric layer surrounding said second metal core having a second dielectric thickness, and a second outer metal layer surrounding said second dielectric layer, said second outer metal layer attached to ground; such that said first and second leads reduce susceptibility to EMI and crosstalk between first and second leads.

Further, the present invention is directed in a second aspect to a die package, comprising a die having a plurality of connection pads; a die substrate supporting a plurality of connection elements; a first lead having a first metal core with a first metal core diameter, a first dielectric layer surrounding said first metal core having a first dielectric thickness, and a first outer metal layer surrounding said first dielectric layer, with a first ground plane being attached to the first outer metal layer; and a second lead having a second metal core with a second metal core diameter, a second dielectric layer surrounding said second metal core having a second dielectric thickness, and a second outer metal layer surrounding said second dielectric layer, with a second ground plane being attached to the second outer metal layer; such that said first and second leads reduce susceptibility to EMI and crosstalk between the first and second leads. The first lead may extend from a first die to one of the plurality of connection elements on the die substrate and/or the second lead may extend from a second die to one of the plurality of connection elements on the dies substrate. The second ground plane may or may not overlay the first ground plane. In the case of an overlay, an intervening layer maintaining electrical isolation may be arranged between the first and second ground planes.

In an additional aspect, the die package according to the invention may be a stacked die package with a first and a second die, each of said dies having a plurality of connection pads; the first lead extending from one of said plurality of connection pads of said first die to one of said plurality of connection elements on said die substrate or to one of said plurality of connection pads of said second die, and the second lead extending from one of said plurality of connection pads of said second die to one of said plurality of connection elements on said die substrate or to one of said plurality of connection pads of said first die.

The dependent claims are directed to advantageous embodiments of the die packages according to the invention, and the respective features disclosed therein may be added separately or in combination.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-13 of the drawings in which like numerals refer to like features of the invention.

Figure 1:
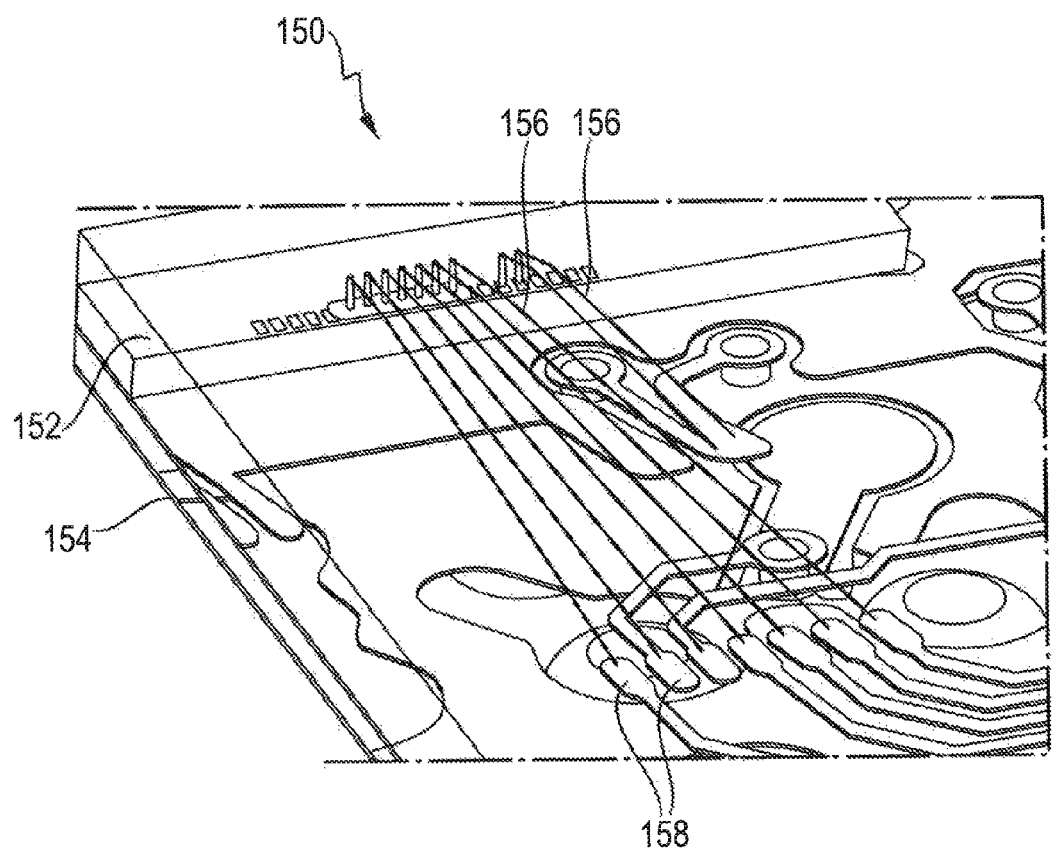
FIG. 1 is an illustration of a fine pitch, low crosstalk die package with dielectric coated leads with outer ground connected metallization.

Leads having electromagnetic shielding and one or more intermediate dielectric layers between a metal core and a ground connectable conductive outer layer can be used to improve package electrical performance. This is depicted in FIG. 1, which illustrates package 150 that includes a die 152 attached to a substrate 154 with leads 156 of differing length. As is apparent, connection pads 158 on substrate 154 are usually at a larger spacing than at the chip side because of process considerations. Die pad spacing is commonly defined by the pitch achievable by the wire bonding machinery. On the substrate side, pitch is defined by the lithographic repeatability for printed circuit board (PCB) type processes and solder, pin, or interconnect element placement accuracy. In practice, wires are spaced more closely at the chip than on the package. This means that as die sizes are reduced, more undesirable electromagnetic field coupling (crosstalk) occurs on the wires, especially in the vicinity of the die. In addition to reducing in-package electromagnetic interference (EMI), leads constructed as described herein have reduced susceptibility to external (to the package) EMI, and will have substantially reduced electromagnetic emissions as well.

Figure 2:
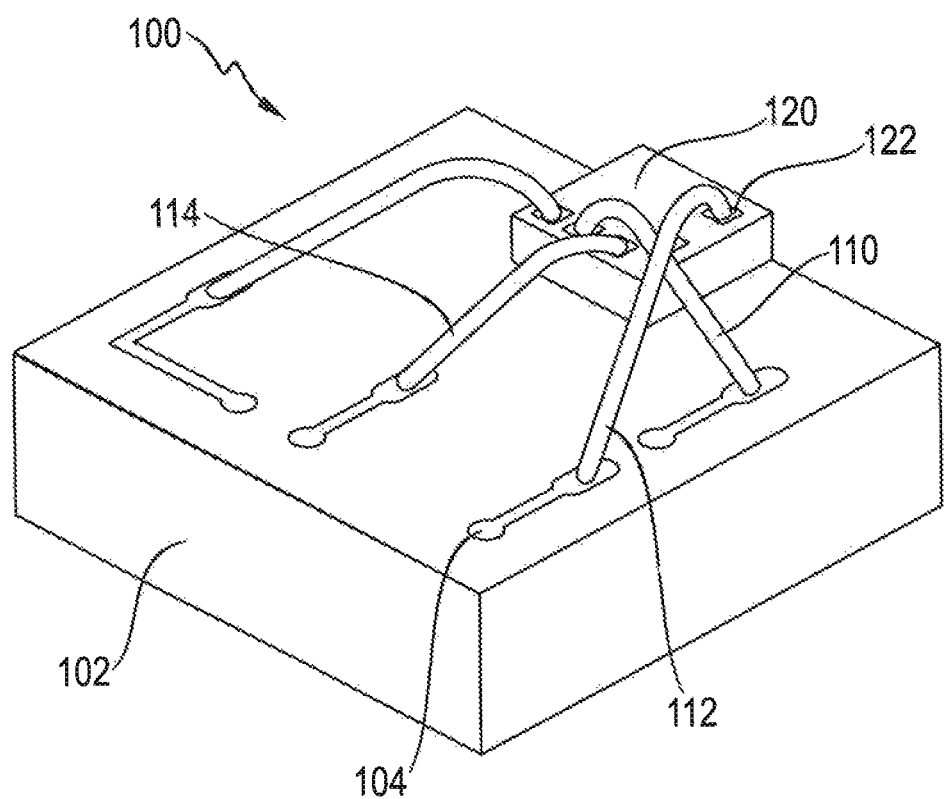
FIG. 2 illustrates low crosstalk overlapping dielectric coated leads with outer ground connected metallization.

As seen in FIG. 2, a semiconductor die packaging system 100 can be formed to have leads 110, 112, and 114 that have low electromagnetic emissions and crosstalk due to lead construction. The die 120, mounted on substrate 102, includes multiple connection pads 122 for signal, power, or other functionality required by the die 120. Substrate 102 may include conductive pads 104 that provide an electrically conductive path out of the package directly or through conductive leadframes, filled vias, conductive traces, second level interconnections, or like. Leads 110, 112, and 114 connect to conductive pads 104, and as illustrated, may have substantially different lengths. As is seen in FIG. 2, leads are narrowly spaced, and are capable of crossing over or under one another (for example, leads 110 and 112 are depicted as crossing over), providing many opportunities for undesirable electromagnetic coupling.

In the illustrated embodiment, leads 110, 112, and 114 have an inner core and an outer metal layer. For example leads 110, 112, and 114 can have a metal core of a defined diameter along its length, the metal core being sequentially coated with a dielectric layer and a conductive metal layer. As compared to a bare lead of the same size without additional dielectric and metal coatings, leads 110, 112, and 114 emit less radiation, are less susceptible to external (to the package) EMI, and less prone to crosstalk. In certain embodiments, due to the superior electrical characteristics of lead construction as disclosed, leads having substantially different lengths but the same core diameter can have substantially the same noise reduction as compared to a bare wire. The measured noise reduction has been shown to be greater than 5 dB to as much as 30 dB over performance compared to a bare lead without dielectric and surrounding metal layer(s). In certain embodiments, resistance to EMI is effective over a range of lead lengths, with two leads capable of having the same cross sectional structure and impedance, but one lead being ten (10) times the length of the other, while still having the same EMI characteristics.

Figure 3:
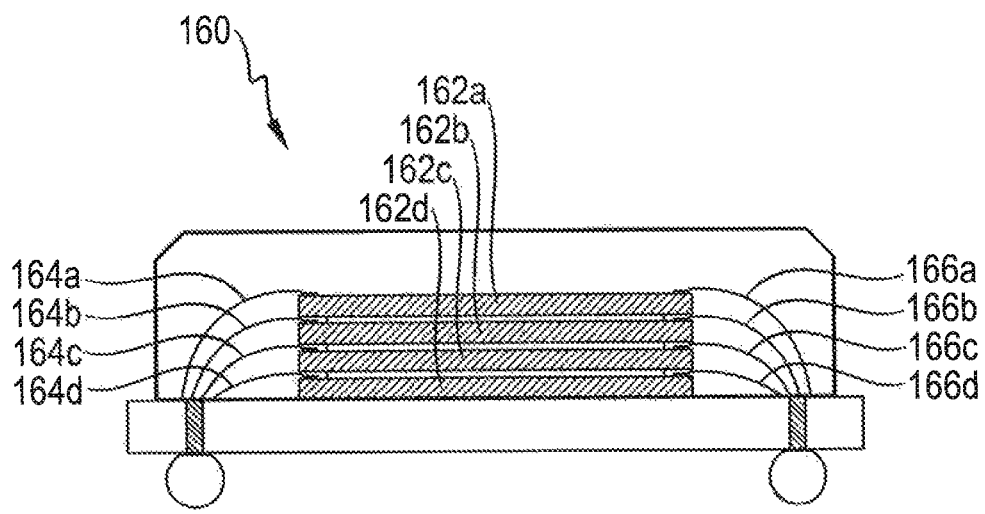
FIG. 3 illustrates low crosstalk leads used in stacked die packages.
Figure 4:
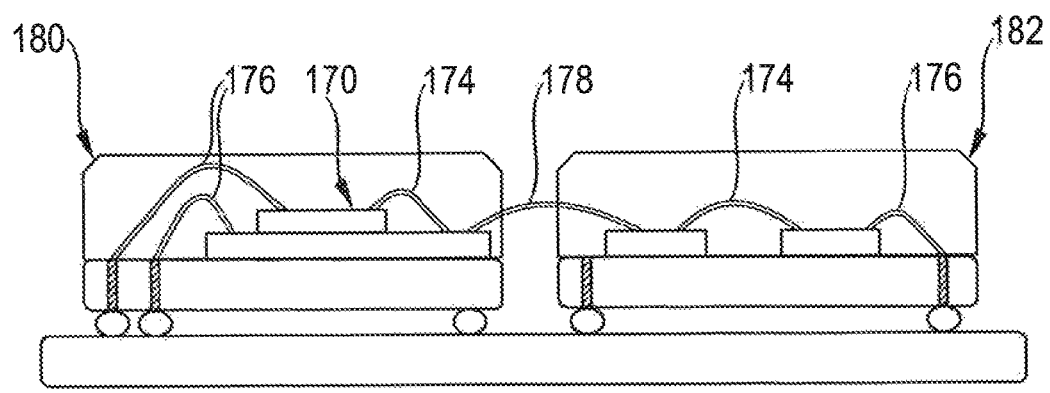
FIG. 4 illustrates low crosstalk leads used in die to die or package to package embodiments.

Electromagnetic field coupling leading to unwanted crosstalk occurs not just on leads that are side by side, but can also occur on leads that are near each other in stacked configurations. This is realized in a stacked die configuration as depicted in FIG. 3, which illustrates stacked die package 160 having dies 162a-d with exemplary leads 164a-d and 166a-d that would create unacceptable crosstalk from leads side by side, above, and below if bare wires were used, rather than leads coated with a dielectric layer and a conductive metal layer as described herein. Similarly, FIG. 4 illustrates die stacks 170 and 172 having die to die lead connections 174, and die to substrate connections 176. There may also be direct die to die connections 178 in separately mounted packaging systems 180, 182 with reduced crosstalk.

Dielectric coated leads used in semiconductor die packages can be formed to have varying dielectric thickness. Both the core diameter and the dielectric thickness may be varied. In certain embodiments, composition of the deposited dielectric may also be varied. This allows, for example, a high performance dielectric having superior vapor barrier, oxygen degradation resistance, or the like, to be thinly deposited over a thick layer of a low cost dielectric material. In another aspect of the illustrated embodiment, leads 110, 112, and 114 (refer: FIGS. 2 and 3) have varying dielectric thickness over an inner core and an outer metal layer, which provide for distinctly different impedances. For example, leads 110 may have a metal core of a defined diameter along its length, the metal core being sequentially coated with a thin dielectric layer and a conductive metal layer. Such leads 110 are suitable for transfer of power because the consequent low impedance and low capacitance reduces power sag. Alternatively, leads 112 have a much thicker dielectric layer suitable for transmission of signal data, while leads 114 have a dielectric layer of intermediate thickness. In certain embodiments, due to the superior electrical characteristics of lead construction as disclosed, it is possible for leads having substantially different lengths but the same core diameter to have substantially the same impedance, within 10% of target impedance, despite having lengths that vary 50% or greater. For example, lead 116 may have about the same impedance as lead 110, despite being twice as long. In certain embodiments, lead differences may be even greater, with two leads having the same cross sectional structure and impedance, but one lead being ten (10) times the length of the other.

Generally, thin dielectric layers will provide low impedance which is beneficial for power line applications; thick dielectric layers are generally beneficial for signal integrity; and outer metal layers on the leads may be advantageously connected to same ground. A combination of core diameters and dielectric thicknesses is possible and a series of such steps may be performed to achieve leads having differing impedances. In certain embodiments it may be desirable to have large cores on power lines to increase power handling capacity, reduce power line temperatures, and/or further reduce any inductance on power supply and ground lines that would exacerbate ground bounce or power sag.

Dielectric layers of intermediate thickness are also useful, since many packages could benefit from having leads of three (3) or more different dielectric thicknesses. A lead having an intermediate dielectric thickness could be used to connect a source and load of substantially different impedance to maximize power transfer. For example, a 10 ohm source can be coupled to a 40 ohm load with a 20 ohm lead. Also, since cost of dielectric can be high, critical signal pathways may be interconnected using thick dielectric, while less critical status or reset leads, or the like, are coated with a dielectric layer having a thickness greater than the power leads, but less than (intermediate) to the critical signal leads. Advantageously, this can reduce dielectric deposition material cost and time.

The precise thickness of the dielectric coating may be chosen, in combination with the wirebond diameter, to achieve a particular desired impedance value for each lead.

$$Z_0 = \sqrt{\frac{L}{C}} = \frac{138}{\sqrt{\varepsilon_r}} \cdot \log\left(\frac{b}{a}\right) \quad (1)$$

The characteristic impedance of a coax line is given in Eq. (1), where L is the inductance per unit length, C is the capacitance per unit length, a is the diameter of the bond wire, b is the outside diameter of the dielectric and $\in_r$ is relative permittivity of the coaxial dielectric.

Figure 5:
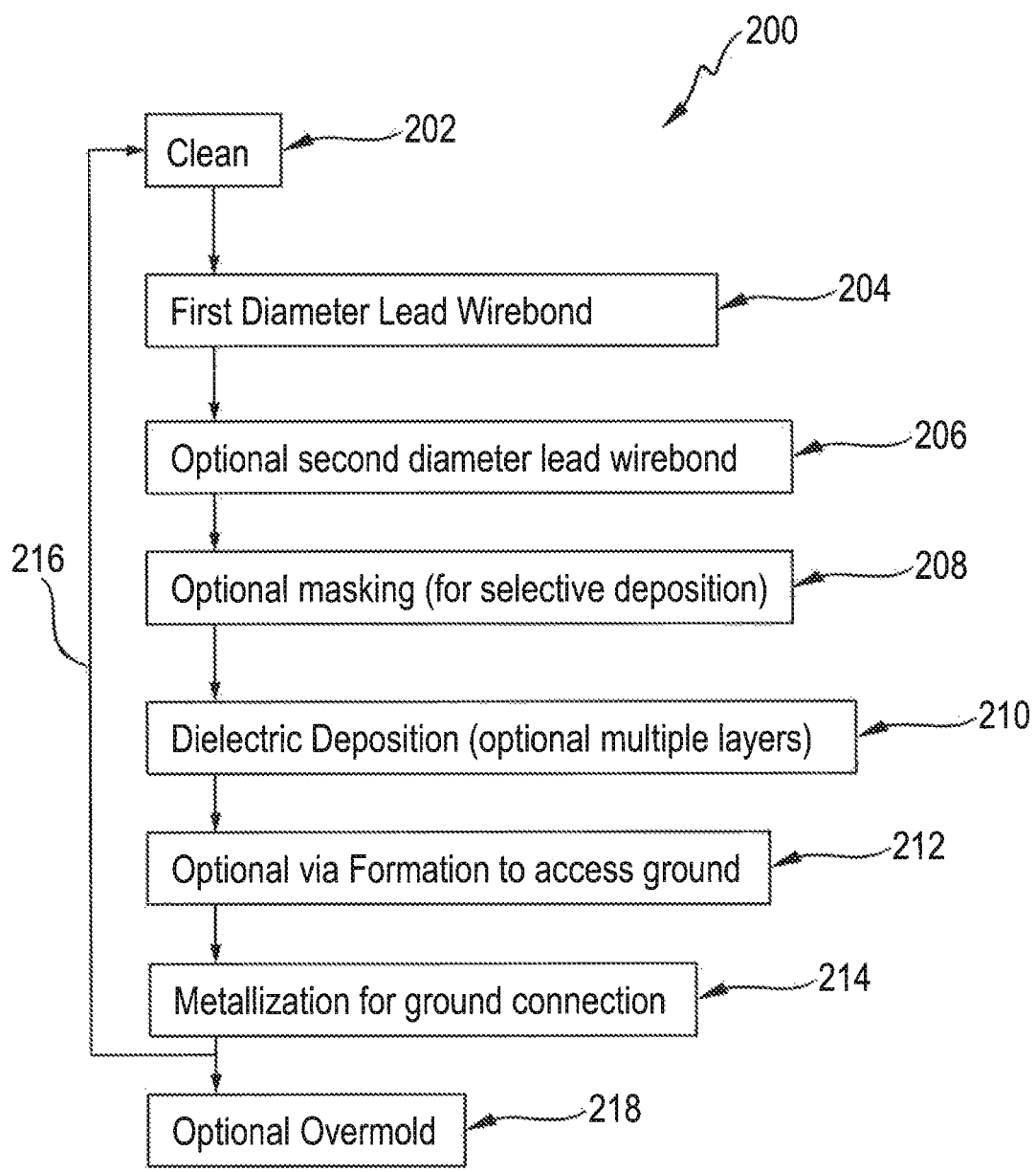
FIG. 5 is a block diagram illustrating method steps for manufacture of dielectric coated leads with outer ground connected metallization.

As illustrated in FIG. 5, in one embodiment manufacture of dielectric coated leads with outer ground connected metallization with or without one or more ground planes can proceed using the following steps illustrated in block diagram 200. In a first step 202, connection pads are cleaned on the die and the substrate. Next, a wire bonder is used to connect the die to the connection pads 204. Optionally, a second diameter wire can be attached 206 (e.g., a larger diameter wire suitable for power connections), or areas of the die can be masked or otherwise protected to allow for selective deposition, step 208. One or more layers of dielectric of the same or different composition may be deposited (step 210), followed by selective laser or thermal ablation, or chemical removal of portions of the dielectric to allow access to ground connections (step 212) covered in the dielectric deposition step 210. This step is optional, since in some embodiments, the need for a ground via may be eliminated. This is particularly true for die operating at higher frequencies, since a virtual RF ground may be established through capacitive coupling and since frequency dependence on thickness value (function of $\in_r$) allows for ground establishment through capacitive coupling. Metallization follows (step 214), covering the dielectric with a metal layer that forms the outermost metallized layer of the leads, and also connecting the leads to ground. The entire process can be repeated multiple times (step 216), useful for those embodiments using selective deposition techniques, and particularly for those embodiments supporting multiple die or complex and varied impedance leads. In the final step (step 218), for non-cavity packages, an overmold can be used to encapsulate leads. The encapsulated leads may be used in high frequency device packages described in U.S. Pat. No. 6,770,822 and in U.S. Pat. No. 8,839,508.

In certain embodiments, modifications and additions to the described process are possible. For example, providing conformal coatings of dielectric can be accomplished through a variety of methods using chemical (electrophoretic), mechanical (surface tension), catalytic primer, electromagnetic (UV, IR), electron beam, or other suitable techniques. Electrophoretic polymers are particularly advantageous because they can rely on self-limiting reactions that can deposit precise thicknesses readily by adjusting process parameters and or simple additive, concentration, chemical, thermal, or timing changes to an electrophoretic coating solution.

In other embodiments, dielectric precoated bondwires can be used to form leads. While commercially available coated wires typically are thinner in dielectric thickness than is necessary to create, for example, 50 ohm leads, the foregoing discussed dielectric deposition steps can be used to increase dielectric thickness to set the desired impedance. Use of these pre-coated wires can simplify other process steps necessary to create coaxial leads, and can allow for thinner layers of needed vapor deposited dielectrics and faster processing times to create ground vias. Pre-coated bondwires may be used to prevent shorting for narrowly spaced or crossing leads. In certain embodiments the pre-coated bondwire may have a dielectric made from a photosensitive material to allow for selective patterning techniques.

In other embodiments, the dielectric Parylene™ can be used. Parylene™ is the trade name for a variety of chemical vapor deposited poly(p-xylylene) polymers used as moisture and dielectric barriers. Parylene™ can be formed in a growth limited condensation reaction using a modified Parylene™ deposition system where the die, substrate, and leads are aligned to a photoplate which allows EM radiation (IR, UV, or other) to strike in a precise manner causing selective growth rate of dielectric. Advantageously, this can minimize or eliminate the need for processes to create contact vias, bulk removal of Parylene™, etc.

Parylene™ and other dielectrics are known to suffer from degradation due to oxygen scission in the presence of oxygen, water vapor, and heat. Damage can be limited by metal layers that form excellent oxygen vapor barriers, with thin layers of 3-5 micron thickness capable of forming true hermetic interfaces. Alternatively, if metal has been selectively removed, or not deposited in certain areas due to electrical, thermal, or manufacturing requirements, a wide range of polymer based vapor oxygen barriers can be used, with polyvinyl alcohol (PVA) being one widely used polymer. These polymers can be glob topped, screen printed, stenciled, gantry dispensed, sprayed onto Parylene™ surface that will be exposed to the oxygen or water vapor environment. Advantageously, use of vapor barrier polymers can be a part of a cost reduction strategy, since thicker layers of high cost Parylene™ or other oxygen sensitive might otherwise be required.

As will be appreciated, all of the described method steps can benefit from various selective deposition techniques. Selective deposition can be by physical masking, directed polymer deposition, photoresist methods, or any other suitable method for ensuring differential deposition thickness on the metal core, dielectric layer, or other outermost layer at time of deposition. While selective deposition allows for additive methods to build leads, it also allows for subtractive techniques in which dielectric or metal is removed to form interconnects of differing impedances. For example, a package populated by one or more die can be wire-bonded as appropriate for interconnect of all package and device pads.

Figure 6:
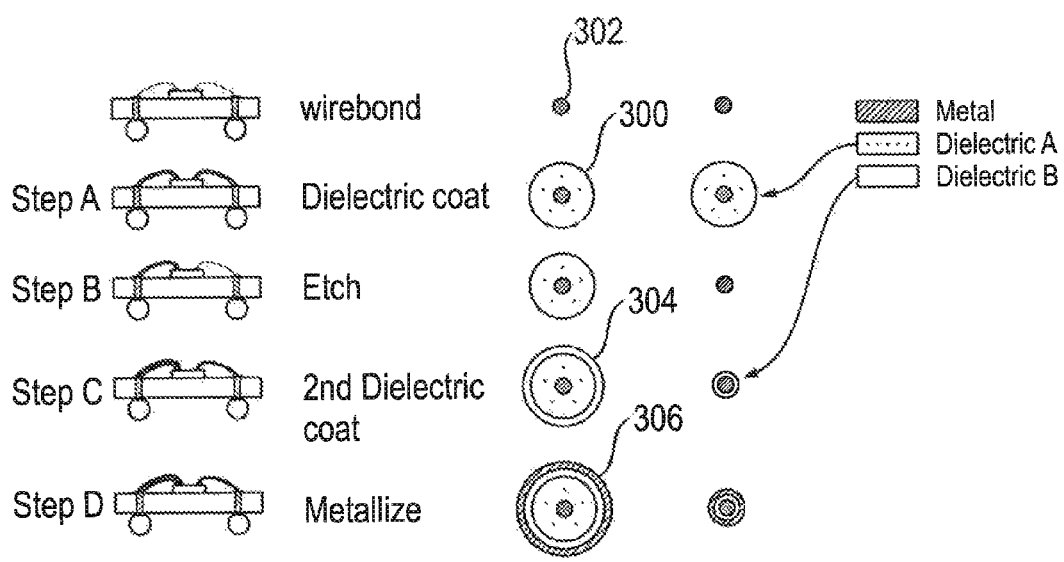
FIG. 6 illustrates a subtractive method for manufacture of dielectric coated leads with outer ground connected metallization.

As seen with respect to FIG. 6, which illustrate steps and structures for manufacture of a die package, the dielectric coating 300 can be deposited to a predetermined thickness over a wirebond metal conductor 302 (step A), where the predetermined thickness of the dielectric is necessary for the secondary interconnect impedance. The secondary impedance wirebond dielectrics can be removed for example by an etch step (step B), followed by a second coating 304 deposition (step C) followed by metallization 306 of both interconnects (step D). This subtractive process will create wirebonds of two distinct impedances.

Figure 7:
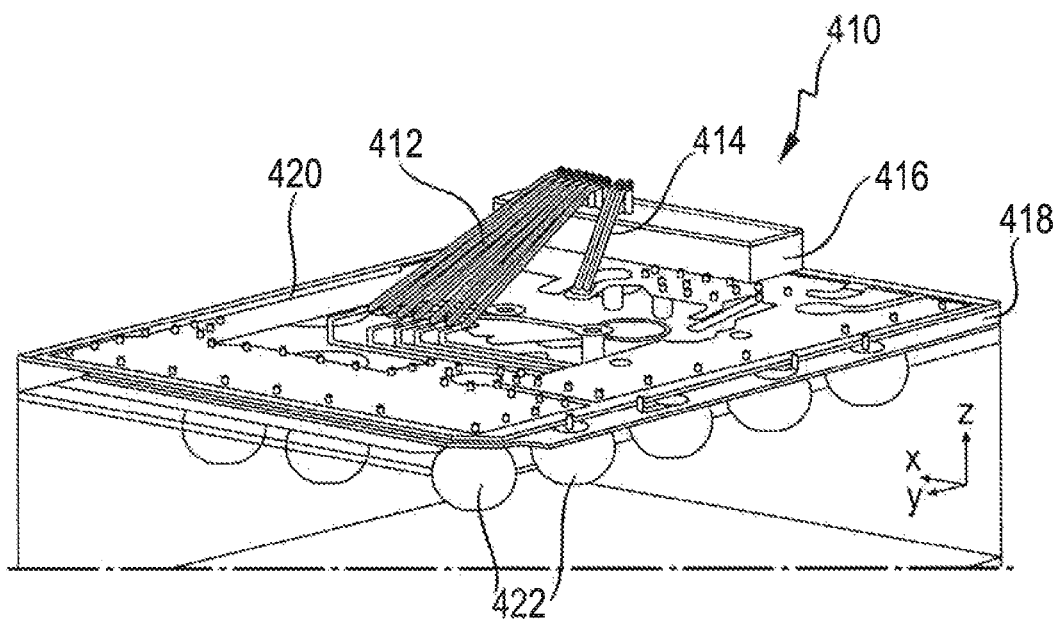
FIG. 7 illustrates a BGA package having dielectric coated leads with outer ground connected metallization.

In an embodiment illustrated with respect to FIG. 7, a ball grid array (BGA) package 410 that includes dielectric and metal coated leads 412, 414 having multiple selected impedances is described. A BGA is a surface-mount packaging widely used for integrated circuits, and can generally provide more interconnection pins than dual in-line, leadframe, or other flat package since the entire bottom surface of the BGA can be used for connection pads. In many types of BGA packages, a die 416 is attached to a substrate 418 having Tillable vias 420 connected to connection pads. Wirebonds 412, 414 may be used to connect the top side die 416 to the pads/vias 420, consequently providing electrical connections from a top side of the substrate 418 to the bottom. In a BGA package, balls of solder 422 are attached to the bottom of the package and held in place with a tacky flux until soldering to a printed circuit board or other substrate. As described herein, the wirebonds of conventional BGA packages can be replaced with improved leads having a dielectric layer and an outer ground connectable metal layer. The leads can have varying dielectric thickness over an inner core and an outer metal layer, as well as being selectively optimized to have specific impedances, which can be selected to be different or well-matched based in part on dielectric layer thickness. As seen in the FIG. 7, both long leads 412 and short leads 414 are supported.

In more detail, assembly of an improved BGA package can require face up attachment of a die to a substrate supporting a connection pad formed adjacent and around a via in the substrate. This assembly is wirebonded as appropriate for each required interconnect, with a wirebond formed between a connection pad on the substrate and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads. The assembly is then subjected to the coating of any essentially conformal dielectric material. Because of its low cost, ease of vacuum deposition, and superior performance characteristics, Parylene™ is preferably used. A small part of the dielectric layer near the leadframe attachment point can be selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package can be completed by placement of an overmold or lid over the die, followed by dicing (singulation) and testing.

Figure 8:
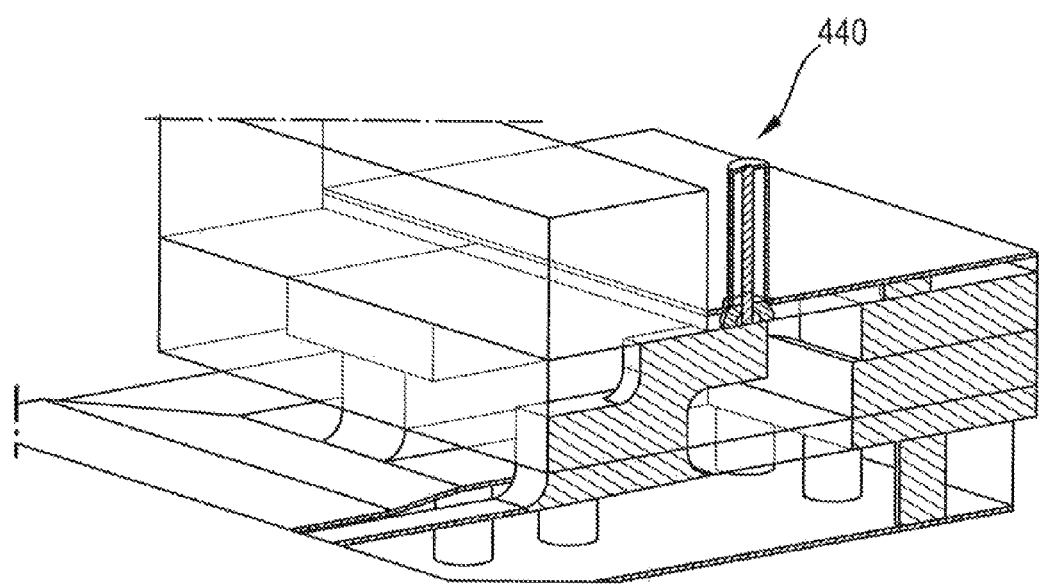
FIG. 8 illustrates a portion of leadframe package having dielectric coated leads with outer ground connected metallization.

Alternatively, in an embodiment illustrated with respect to FIG. 8, low cost leadframe based die package 440 including wire bonds extending from the die to a leadframe can be manufactured by forming a leadframe strip containing a two-dimensional array of individual package sites and outside frame portion. Leadframe fabrication is conventional, and can include formation of separate leads through etching, stamping, or electrodeposition. The leadframe strip can be placed in a mold including, but not limited to, an injection molding or transfer molding apparatus. An appropriate dielectric material, preferably plastic such as commercially available epoxy mold compound, is injected, pumped, or otherwise transferred into the mold to achieve a leadframe/mold material composite structure. The properties of the mold material are important for their dielectric constant, loss tangent, and electrically dispersive properties as well as their temperature, moisture, and other mechanical performance attributes.

Each package site on the resulting composite leadframe strip is cleaned of mold release material and or mold-flash, and prepared for deposition of a metal finish over the exposed metal portions of the leadframe. This may be accomplished through plating techniques such as immersion or electroplating, and the metals would be chosen for corrosion suppression and ease of wirebonding. An example of such finishing is a thin layer of nickel (for protection) followed by a layer of gold (added protection and ability to wirebond). Each package site of the resultant molded leadframe strip can then be populated with the required die, which are attached to the base with die attach material being chosen for mechanical and thermal properties for a particular packaging application. The resultant assembly is then wirebonded as appropriate for each required interconnect, with a wirebond formed between a lead on the leadframe and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads.

Like the foregoing described BGA package 410, the populated leadframe strip is then subjected to the coating of any essentially conformal dielectric material including Parylene™. In the case of Parylene™, it may be preferable to mask the bottom of the packages with tape, such as a vacuum-compatible polyimide with acrylic adhesive, or similar material to prevent deposition onto the area of the leads that will eventually attached to the PCB. This will facilitate easier soldering at a subsequent step. A small part of the dielectric layer near the leadframe attachment point is selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package is completed by placement of an overmold or lid over the die, followed by dicing (singulation) and testing.

Example 1—Crosstalk Performance

Figure 9A:
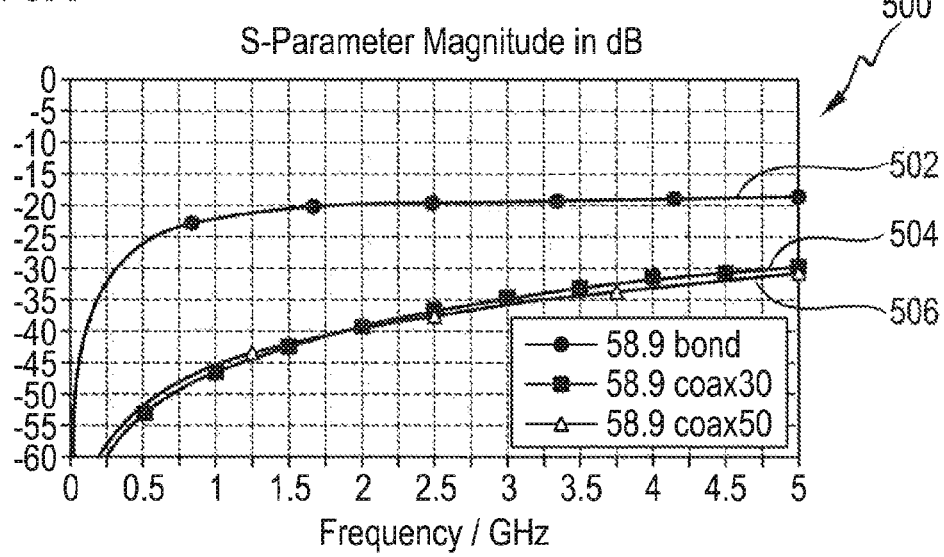
FIGS. 9A and 9B illustrate S-parameter measurements of frequency based crosstalk levels.

FIG. 9A is a graph 500 depicting cross-talk comparison as a function of frequency of bare wirebond 502, 30 ohm coax 504, and 50 ohm coax 506. Both coaxial leads exhibit approximately 25 dB improvement in cross-talk/isolation over the unshielded interconnect. In this regards, even a mismatched coaxial lead prepared according to the present invention is superior to an unshielded bare lead.

Figure 9B:
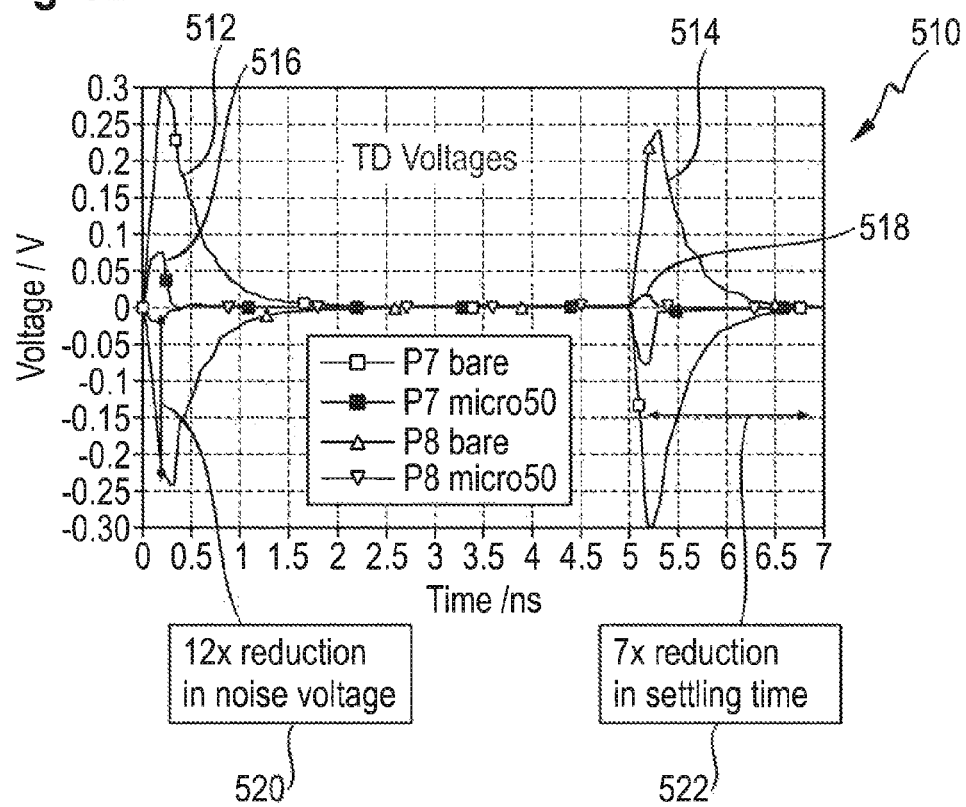

FIG. 9B is a graph 510 depicting comparison of bare bond 512, 514 and 50 ohm coaxial leads 516, 518 behavior in time domain. Consistent with the frequency results depicted in FIG. 9A, noise voltage is reduced as much as 12-fold (cross-talk/isolation) 520 and settling time response is improved 7-fold 522 (permitting increased bandwidth).

Figure 10A:
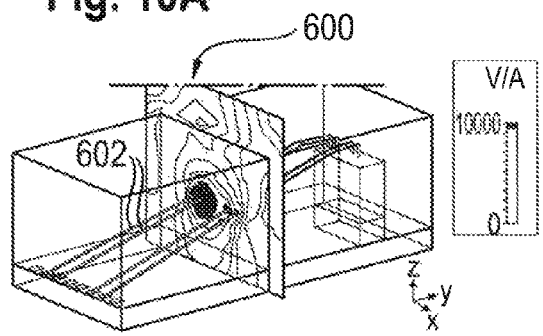
FIGS. 10A-D illustrate EM fields associated with single and differential leads with dielectric coating and outer ground connected metal layer, respectively.
Figure 10B:
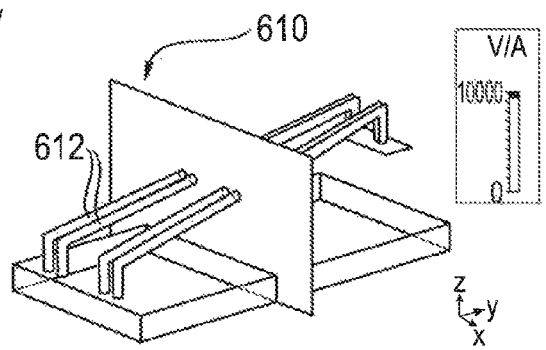

FIGS. 10A-D illustrate spatial amplitude plots of EM field amplitudes associated with single and differential leads with and without dielectric coating and outer ground connected metal layer, respectively. FIG. 10A depicts an amplitude plot 600 of single ended bond wires 602. As shown, the EM field amplitude at a point along the y-axis of the bond wire is significant. FIG. 10B depicts an amplitude plot 610 of single ended micro coaxial lines 612. As is apparent, the coaxial leads have substantially reduced electromagnetic emissions as compared to bare leads.

Figure 10C:
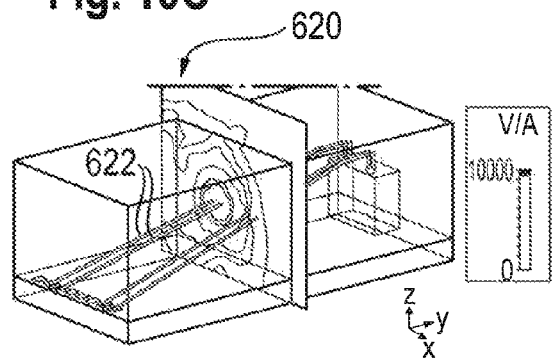
Figure 10D:
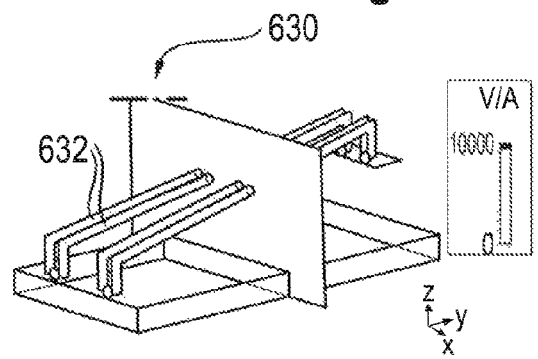

This is of particularly utility for differential pairs, a technique commonly used with bare leads to improve noise immunity. Typically, a pair of leads driven with signals that are at opposing polarities will be subjected to roughly equal noise environments. When these two signals are added together differentially, the common noise can be cancelled out. However, if noise environments are not equivalent, as can happen for fine pitch placement of many pairs of leads, a neighboring noise source can induce a larger signal on the nearest neighbor of the differential pair than on the farther neighbor. Shielded micro-coaxial pairs are thus much more noise immune because the noise is highly attenuated before reaching the signal line. FIG. 10C depicts a spatial amplitude plot 620 of differential bond wires 622. FIG. 10D depicts a spatial amplitude plot 630 of differential micro-coaxial lines 632. The plot presents almost complete shielding, that is, negligible emissions of electromagnetic radiation.

Figure 11A:
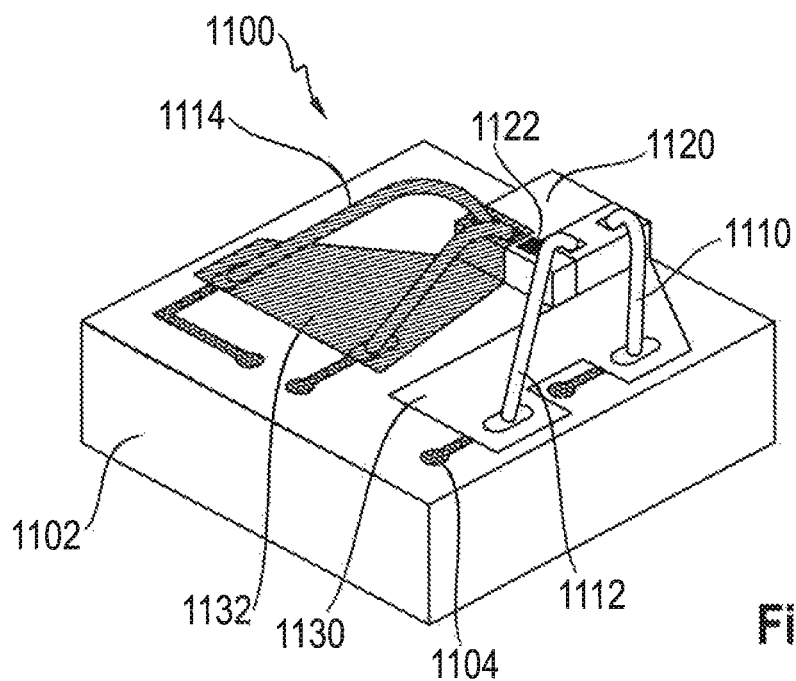
FIGS. 11a and 11b illustrate die packages in accordance with the invention with leads coated with a dielectric and metal connected to separate ground planes that may or may not overlap.
Figure 11B:
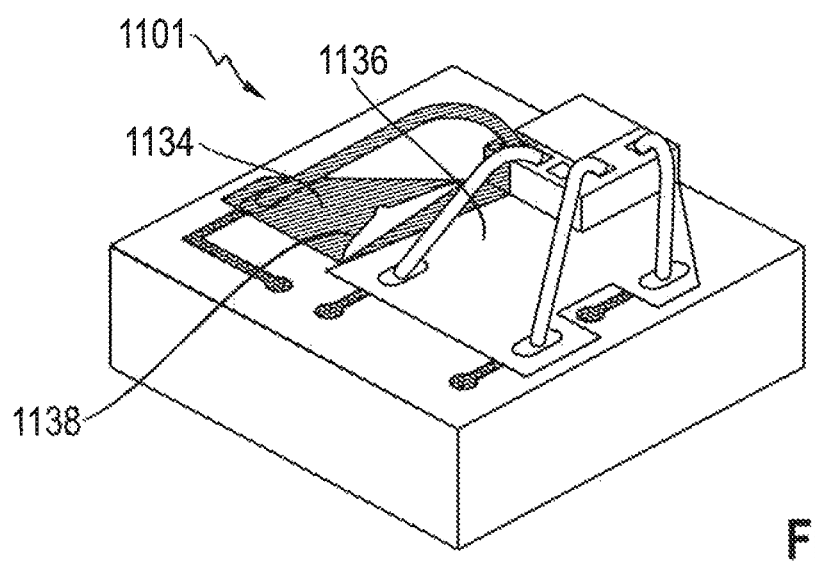

As seen in FIGS. 11a and 11b a semiconductor die packaging system 1100 can be formed to have multiple separated or overlapping ground planes. Leads 1110, 1112, and 1114 can be manufactured to have low electromagnetic emissions and crosstalk due to lead construction and connection to a ground plane. The die 1120, mounted on die substrate 1102, includes multiple connection pads 1122 for signal, power, or other functionality required by the die 1120. The die substrate can include conductive pads 1104 that provide an electrically conductive path out of the package, directly, or through conductive leadframes, filled vias, conductive traces, second level interconnections, or like. Leads 1110, 1112, and 1114 connect to conductive pads 1104, and as illustrated, may have substantially different lengths.

In the illustrated embodiment, leads 1110 and 1112 have an inner core and an outer metal layer connected to a first ground plane 1130. In contrast, leads 1114, also have an inner core and an outer metal layer is connected to a second ground plane 1132 separate and distinct from the first ground plane 1130. Similarly, FIG. 11b illustrates a package 1101 of equivalent design to package 11a, with the exception that ground planes 1134 and 1136 physically overlap. The ground planes are electrically distinct, however, since a dielectric coating 1138 (shown partially removed) can be used to isolate the grounds 1134 and 1136 from each other. As will be understood, the leads 1110, 1112, and 1114 can have a metal core of a defined diameter along its length, the metal core being sequentially coated with a dielectric layer and a conductive metal layer.

As compared to a bare lead of the same size without additional dielectric and metal coatings, leads 1110, 1112, and 1114 emit less radiation, are less susceptible to external (to the package) EMI, and less prone to crosstalk. In certain embodiments, due to the superior electrical characteristics of lead construction as disclosed, leads having substantially different lengths but the same core diameter can have substantially the same noise reduction as compared to a bare wire. The measured noise reduction can be greater than 5 dB to as much as 30 db over performance compared to a bare lead without dielectric and surrounding metal layer. In certain embodiments, resistance to EMI is effective over a range of lead lengths, with two leads capable of having the same cross sectional structure and impedance, but one lead being ten (10) times the length of the other, while still having the same EMI characteristics.

Examples 2, 3, 4—Crosstalk Performance

Example 2

Figure 12:
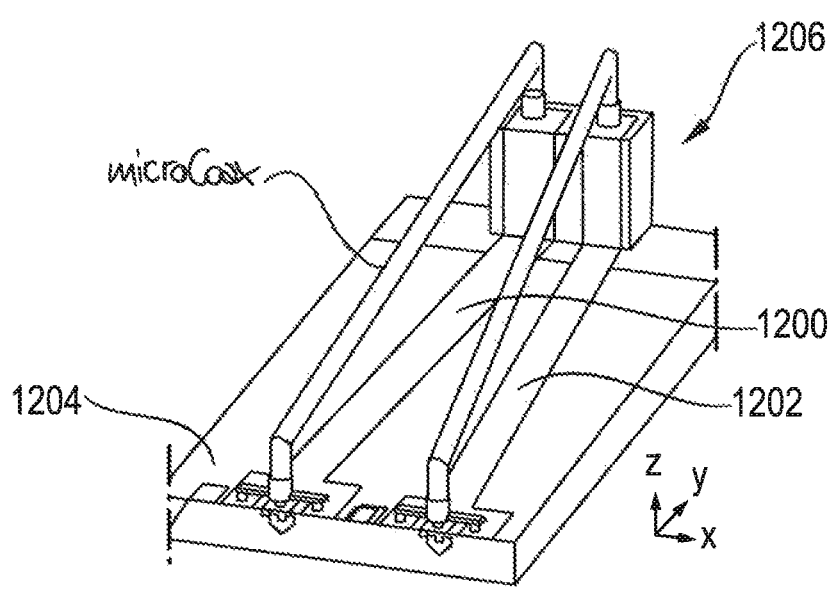
FIG. 12 illustrates a die package in accordance with the invention with two ground planes.

FIG. 12 illustrates an example of an embodiment with two ground planes 1200, 1202, both extending from the package substrate 1204 to the die 1206 to permit connection at both lead ends.

Example 3

Figure 13:
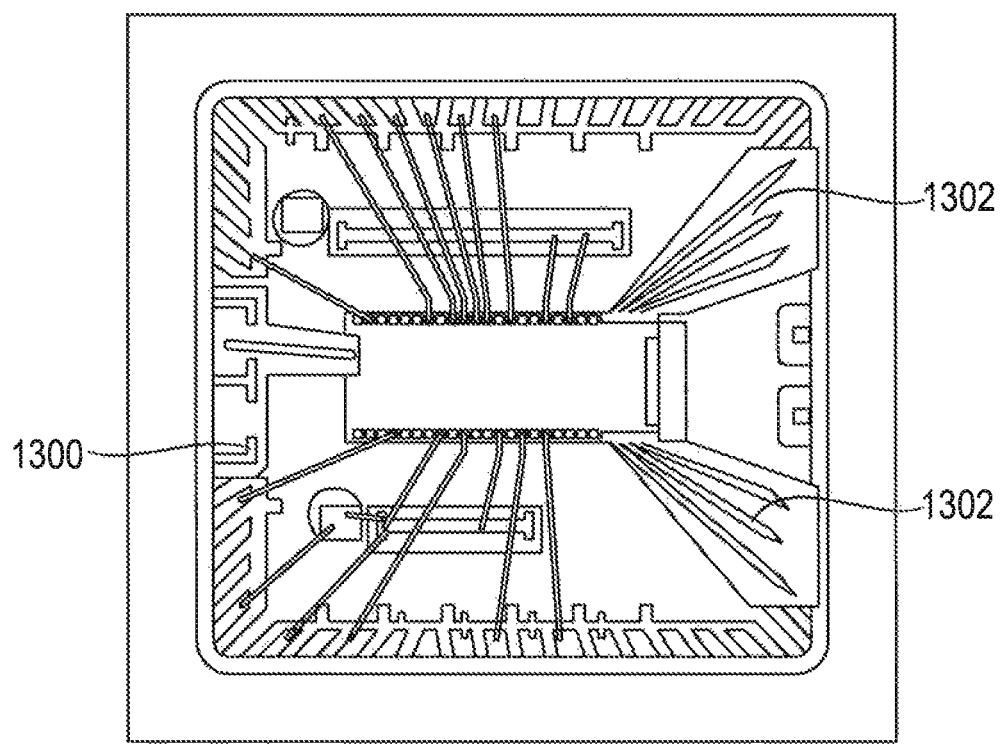
FIG. 13 illustrates a further example embodiment with two ground planes respectively forming an RF ground shield and a DC power shield.

FIG. 13 illustrates an example embodiment with two ground planes respectively forming an RF ground shield 1300 and a DC power ground shield 1302.

Example 4

In another embodiment, multiple impedance interconnects can be achieved through a variant of the above process. A substrate supporting a die is wire-bonded with 0.7 mil wire as appropriate for interconnect of all package and device pads. The resultant package assembly is subjected to 1.31 microns of coating with Parylene™ C dielectric. A process to open vias to ground connections for power on the package and corresponding power ground connections on the device is performed. A first selective metallization process is performed that creates metal only in areas associated with the power interconnects and their associated grounds. This selective metallization is accomplished through physical masking, lithography, or other selective process. Thus, complete 5 ohm coaxial interconnects have been formed. At this juncture, a second coating of dielectric is deposited to achieve a total dielectric thickness of 26.34 microns. A second via process is performed on all grounds needed for signal lines. This step may also include connections to power supply ground if so desired. A second metallization is performed to create the ground shield for the 50 ohm lines. Thus, a combination of 5 ohm and 50 ohm interconnects is achieved, with the option of separate decoupled ground planes for power and signal lines.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

In particular, the present invention is directed to: a stacked die package with superior EMI performance, comprising a first and a second die, with each die respectively having a plurality of connection pads, a die substrate supporting a plurality of connection elements, a first lead extending from a first die to one of the plurality of connection elements on the die substrate, the first lead having a first metal core with a first core diameter, a dielectric layer surrounding the first metal core having a first dielectric thickness, and an outer metal layer attached to ground, and a second lead extending from a second die to one of the plurality of connection elements on the die substrate, the second lead having a second metal core with a second core diameter, and a dielectric layer surrounding the second metal core having a second dielectric thickness, and an outer metal layer attached to ground, to reduce susceptibility to EMI and crosstalk between first and second leads.

The above die package, wherein the first lead crosses over the second lead, or is above the second lead.

The die substrate can have filled vias to allow formation of BGA package, and/or a leadframe to form a leadframe package.

The invention includes die to die connections as well as die to substrate connections.

Further, the present invention is directed to a BGA package with superior EMI performance, comprising a die having a plurality of connection pads, a die substrate supporting a plurality of connection elements, a plurality of leads, each having a metal core, a dielectric layer surrounding the metal core, and an outer metal layer connected to ground, with crosstalk noise reduced greater than 5 dB as compared to a leads without a dielectric layer surrounding the metal core and an outer metal layer.

Further, the present invention includes a differential pair with reduced crosstalk and crossover, long loop leads out of plane with reduced crosstalk.

Further the present invention includes a die package, comprising a die having a plurality of connection pads, a die substrate supporting a plurality of connection elements, a first lead extending from a first die to one of the plurality of connection elements on the die substrate, the first lead having a first metal core with a first core diameter, a dielectric layer surrounding the first metal core having a first dielectric thickness, and an outer metal layer, a first ground plane attached to the outer metal layer of the first lead, a second lead extending from a second die to one of the plurality of connection elements on the die substrate, the second lead having a second metal core with a second core diameter, and a dielectric layer surrounding the second metal core having a second dielectric thickness, and a second ground plane attached to the outer metal layer of the second lead.

In the above die package, the second ground plane may overlay the first ground plane, with a intervening dielectric layer maintaining electrical isolation between the first and second ground planes.

The die package may be built in the form of a BGA package and/or a leadframe package.

Thus, having described the invention, what is claimed is:

1. A die package comprising:
   a die having a plurality of connection pads;
   a die substrate supporting a plurality of connection elements;
   a first lead having a first metal core with a first metal core diameter, a first dielectric layer surrounding said first metal core having a first dielectric thickness, and a first outer metal layer surrounding said first dielectric layer, said first outer metal layer attached to a first ground plane; and
   a second lead having a second metal core with a second metal core diameter, a second dielectric layer surrounding said second metal core having a second dielectric thickness, and a second outer metal layer surrounding said second dielectric layer, said second outer metal layer attached to a second ground plane;
   such that susceptibility to EMI and crosstalk between the first and second leads are reduced, wherein the first ground plane is separate and distinct from the second ground plane.

2. The die package of claim 1, wherein the first lead extends from a first die to one of the plurality of connection elements on the die substrate, and the second lead extends from a second die to one of the plurality of connection elements on the die substrate, the first ground plane attached to said first outer metal layer and the second ground plane attached to said second outer metal layer.

3. The die package of claim 1, wherein the first metal core diameter differs from the second metal core diameter, or alternatively, wherein the first metal core diameter is the same as the second metal core diameter.

4. The die package of claim 1 wherein the die package includes a first and a second die, each of said dies having a plurality of connection pads, the first lead extending from said first die to one of said plurality of connection elements on said die substrate or to one of said plurality of connection pads of said second die, and the second lead extending from said second die to one of said plurality of connection elements on said die substrate or to one of said plurality of connection pads of said first die.

5. The die package of claim 1 wherein, the first dielectric layer thickness differs from the second dielectric layer thickness, or alternatively, wherein the first dielectric layer thickness is the same as the second dielectric layer thickness.

6. The die package of claim 1, wherein the die package is a stacked die package.

7. The die package of claim 1, wherein said die substrate includes filled via to allow formation of a BGA package.

8. The die package of claim 1, wherein the die substrate includes a leadframe to form a leadframe package.

9. The die package of claim 1, wherein the first lead crosses over the second lead and/or is above the second lead.

10. The die package of claim 1, wherein the first lead has a first length and a first impedance and the second lead has a second length and a second impedance, wherein said first length is different from said second length and/or said first impedance is different from said second impedance.

11. The die package of claim 1, wherein said first metal core and/or said second metal core is sequentially coated with a dielectric layer and a conductive metal layer.

12. The die package of claim 1, wherein the first and second leads provide electrical communication for die-to-die connection and/or die-to-substrate connection.

13. The die package of claim 1, wherein of the first and second leads include at least one differential pair.

14. The die package of claim 1 wherein the first and second leads include crossover, long loop leads out of plane with reduced crosstalk.

15. A die package comprising:
a die having a plurality of connection pads;
a die substrate supporting a plurality of connection elements;
a first lead having a first metal core with a first metal core diameter, a first dielectric layer surrounding said first metal core having a first dielectric thickness, and a first outer metal layer surrounding said first dielectric layer, said first outer metal layer attached to a first ground plane; and
a second lead having a second metal core with a second metal core diameter, a second dielectric layer surrounding said second metal core having a second dielectric thickness, and a second outer metal layer surrounding said second dielectric layer, said second outer metal layer attached to a second ground plane;
such that susceptibility to EMI and crosstalk between the first and second leads are reduced;
wherein the first ground plane is separate and distinct from the second ground plane;
wherein the first lead extends from a first die to one of the plurality of connection elements on the die substrate, and the second lead extends from a second die to one of the plurality of connection elements on the die substrate, the first ground plane attached to said first outer metal layer and the second ground plane attached to said second outer metal layer; and
wherein the second ground plane overlays the first ground plane with an intervening layer maintaining electrical isolation between the first and second ground plane.

16. A BGA package with superior EMI performance including a die package comprising:
a die having a plurality of connection pads;
a die substrate supporting a plurality of connection elements;
a first lead having a first metal core with a first metal core diameter, a first dielectric layer surrounding said first metal core having a first dielectric thickness, and a first outer metal layer surrounding said first dielectric layer, said first outer metal layer attached to a first ground plane; and
a second lead having a second metal core with a second metal core diameter, a second dielectric layer surrounding said second metal core having a second dielectric thickness, and a second outer metal layer surrounding said second dielectric layer, said second outer metal layer attached to a second ground plane;
such that susceptibility to EMI and crosstalk between the first and second leads are reduced wherein said crosstalk noise is reduced at least 5 dB as compared to leads without a dielectric layer surrounding the metal core and having an outer metal layer,
wherein the first ground plane is separate and distinct from the second ground plane.

17. A die package comprising:
a die having a plurality of connection pads;
a die substrate supporting a plurality of connection elements;
a first lead having a first metal core with a first metal core diameter, a first dielectric layer surrounding said first metal core having a first dielectric thickness, and a first outer metal layer surrounding said first dielectric layer, said first outer metal layer attached to a first ground plane; and
a second lead having a second metal core with a second metal core diameter, a second dielectric layer surrounding said second metal core having a second dielectric thickness, and a second outer metal layer surrounding said second dielectric layer, said second outer metal layer attached to a second ground plane;
such that susceptibility to EMI and crosstalk between the first and second leads are reduced, and wherein the first ground plane and the second ground plane are electrically distinct, but physically overlap.

* * * * *